United States Patent
Xie

(10) Patent No.: US 10,236,388 B2
(45) Date of Patent: Mar. 19, 2019

(54) DUAL GATE OXIDE THIN-FILM TRANSISTOR AND MANUFACTURING METHOD FOR THE SAME

(71) Applicant: Wuhan China Star Optoelectronics Technology Co., Ltd., Wuhan, Hubei (CN)

(72) Inventor: Yingtao Xie, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 46 days.

(21) Appl. No.: 15/328,189

(22) PCT Filed: Aug. 16, 2016

(86) PCT No.: PCT/CN2016/095421
§ 371 (c)(1),
(2) Date: Jan. 23, 2017

(87) PCT Pub. No.: WO2017/215109
PCT Pub. Date: Dec. 21, 2017

(65) Prior Publication Data
US 2018/0212061 A1    Jul. 26, 2018

(51) Int. Cl.
*H01L 27/14*     (2006.01)
*H01L 29/786*   (2006.01)
(Continued)

(52) U.S. Cl.
CPC ...... *H01L 29/78648* (2013.01); *H01L 27/124* (2013.01); *H01L 27/127* (2013.01);
(Continued)

(58) Field of Classification Search
CPC . H01L 27/1225; H01L 27/124; H01L 27/127; H01L 29/78648
(Continued)

(56) References Cited

U.S. PATENT DOCUMENTS

| 6,933,571 B2 * | 8/2005 | Inoue | H01L 23/3672 |
| | | | 257/347 |
| 9,391,157 B2 * | 7/2016 | Suzuki | H01L 29/78606 |
| 2015/0144952 A1 * | 5/2015 | Kim | H01L 27/3262 |
| | | | 257/72 |

FOREIGN PATENT DOCUMENTS

| CN | 202084546 U | 12/2011 |
| CN | 102640292 A | 8/2012 |

(Continued)

Primary Examiner — Tan N Tran
(74) Attorney, Agent, or Firm — Andrew C. Cheng

(57) ABSTRACT

A dual gate oxide thin-film transistor and manufacturing method for the same. The thin-film transistor comprises: a substrate; a bottom gate electrode formed on the substrate; a first gate insulation layer disposed on the bottom gate electrode; a semiconductor layer formed on the first gate insulation layer; a second gate insulation layer formed on the semiconductor layer; and a top gate electrode formed on the second gate insulation layer; wherein, the transistor further comprises a data line, the data line and the bottom gate electrode, or the data line and the top gate electrode are located at a same metal layer. Because the data line and the bottom gate (or the top gate) electrodes are located at a same metal layer, and through one photolithography for patterning to reduce the number of the mask, decrease the production cost. Besides, the stability and the response speed are increased.

9 Claims, 5 Drawing Sheets

(51) Int. Cl.
 *H01L 27/12* (2006.01)
 *H01L 29/66* (2006.01)
 *H01L 21/02* (2006.01)
 *H01L 21/027* (2006.01)
 *H01L 21/4763* (2006.01)
 *H01L 29/24* (2006.01)

(52) U.S. Cl.
 CPC .... *H01L 27/1225* (2013.01); *H01L 29/66969* (2013.01); *H01L 29/786* (2013.01); *H01L 29/78693* (2013.01); *H01L 21/0274* (2013.01); *H01L 21/02164* (2013.01); *H01L 21/02178* (2013.01); *H01L 21/02565* (2013.01); *H01L 21/02592* (2013.01); *H01L 21/47635* (2013.01); *H01L 29/247* (2013.01)

(58) Field of Classification Search
 USPC .................................. 257/43, 59, 72, 432
 See application file for complete search history.

(56) References Cited

FOREIGN PATENT DOCUMENTS

| | | |
|---|---|---|
| CN | 203085533 U | 7/2013 |
| CN | 103296090AA | 9/2013 |
| CN | 203250095 U | 10/2013 |
| JP | 2003101029 A | 4/2003 |

* cited by examiner

DUAL GATE OXIDE THIN-FILM TRANSISTOR AND MANUFACTURING METHOD FOR THE SAME

BACKGROUND OF THE INVENTION

1. Field of the Invention

The present invention relates to a display technology field, and more particularly to a dual gate oxide thin-film transistor and a manufacturing method for the same.

2. Description of Related Art

The carrier mobility of an oxide thin-film transistor is 20-30 times of an amorphous silicon transistor, which can greatly increase a charging and discharging rate for a pixel electrode by a TFT so as to increase the response speed of the pixel and realize a faster refresh rate. At the same time, a faster response can greatly increase a row scanning rate of the pixel such that an ultra-high resolution can be realized in a TFT-LCD. Therefore, the oxide thin-film transistor gradually becomes a powerful competitor in a next generation display technology. However, when the above technology is applied in a mass production of the display panel, an important restriction factor is existed: the stability of the above technology is not enough. Accordingly, a dual gate structure having a higher stability is widely interested.

The structure of a dual gate oxide thin-film transistor is usually to clamp an active layer between two gate electrodes. Comparing with a thin-film transistor only having one gate, the dual gate oxide thin-film transistor has a complicated structure and relative complex manufacturing process so that the cost is relative higher. This shows that the improvement and optimization of the structure and manufacturing method for a conventional dual gate oxide thin-film transistor has great research significance and an application value.

SUMMARY OF THE INVENTION

In order to overcome the disadvantage of the conventional art, the purpose of the present invention is to provide a dual gate oxide thin-film transistor and a manufacturing for the same. Through the improvement and optimization of the structure and manufacturing method for a dual gate oxide thin-film transistor, the stability of the thin-film transistor is increased and the performance of the thin-film transistor is increased so as to optimize the manufacturing process, and decrease the production cost.

The present invention includes two aspects, in one aspect, the present invention provides a dual gate oxide thin-film transistor, comprising:

a substrate; a bottom gate electrode formed on the substrate; a first gate insulation layer disposed on the bottom gate electrode; a semiconductor layer formed on the first gate insulation layer; a second gate insulation layer formed on the semiconductor layer; and a top gate electrode formed on the second gate insulation layer; wherein, the dual gate oxide thin-film transistor further comprises a data line, the data line and the bottom gate electrode are located at a same metal layer or the data line and the top gate electrode are located at a same metal layer.

(For data line—the bottom gate electrode) optionally, the data line is located on the substrate, and the data line and the bottom gate electrode are located at the same metal layer.

(For data line—the top gate electrode) optionally, the data line is located on the second gate insulation layer, and the data line and the top gate electrode are located at a same metal layer.

(For source electrode and drain electrode) furthermore, the dual gate oxide thin-film transistor further comprises a source electrode and a drain electrode respectively located at two sides of the semiconductor layer, and the source electrode and the drain electrode are obtained through performing a plasma treatment to the semiconductor layer.

(For interconnection layer and contact hole) furthermore, the dual gate oxide thin-film transistor further comprises an interconnection layer formed on the top gate electrode; the interconnection layer is provided with multiple contact holes; the multiple contact holes are respectively corresponding to the data line, the source electrode and the drain electrode; and the multiple contact holes respectively expose an upper surface of the data line, an upper surface of the source electrode and an upper surface of the drain electrode.

(For ITO) furthermore, the dual gate oxide thin-film transistor further comprises an ITO film layer formed on the interconnection layer and inside the multiple contact holes; the ITO film layer is used for realizing an interconnection between the data line and the source electrode and/or an interconnection between the drain electrode and the ITO film layer.

(Specifically) furthermore, the ITO film layer includes a first ITO film layer and a second ITO film layer, the first ITO film layer is used for realizing an interconnection between the data line and the source electrode and the second ITO film layer is interconnected with the drain electrode.

(For patterning) furthermore, the bottom gate electrode is a patterned bottom gate electrode.

Furthermore, the top gate electrode is a patterned top gate electrode.

Furthermore, the semiconductor layer is a patterned semiconductor layer.

Furthermore, the data line is a patterned data line.

Furthermore, the second ITO film layer is a patterned second ITO film layer.

(For material) furthermore, the first gate insulation layer selects a SiOx or an aluminum oxide.

Furthermore, the second gate insulation layer selects a SiOx or an aluminum oxide.

Furthermore, the semiconductor layer selects an amorphous IGZO thin film.

Furthermore, the interconnection layer is one of or a combination of a SiOx thin film and a SiNx thin film.

In a second aspect, the present invention provides a manufacturing method for a dual gate oxide thin film transistor, comprising steps of:

preparing a substrate, forming a bottom gate electrode on the substrate;

forming a first gate insulation layer on the bottom gate electrode;

forming a semiconductor layer on the first gate insulation layer;

forming a second gate insulation layer on the semiconductor layer; and forming a top gate electrode on the second gate insulation layer;

wherein, the dual gate oxide thin-film transistor further comprises a data line, the data line and the bottom gate electrode are located at a same metal layer, or the data line and the top gate electrode are located at a same metal layer.

(For the bottom gate electrode) furthermore, the step of forming a bottom gate electrode on the substrate comprises forming a first metal layer on the substrate and patterning the first metal layer to obtain the patterned bottom gate electrode.

(For the data line and bottom gate electrode) furthermore, the step of forming a bottom gate electrode on the substrate comprises forming a first metal layer on the substrate and patterning the first metal layer one time in order to simultaneously obtain the patterned data line and the patterned bottom gate electrode such that the data line and the bottom gate electrode are located at the same metal layer and are both located on the substrate.

Preferably, in the manufacturing method of the present invention, patterning the first metal layer adopts one photolithography process to perform a patterning process.

(For the semiconductor layer) furthermore, after forming a semiconductor layer on the gate insulation layer, patterning the semiconductor layer in order to obtain a patterned semiconductor layer, the patterned semiconductor layer also corresponds to an upper location of the bottom gate electrode.

Preferably, the step of patterning the semiconductor layer adopts a photolithography process to perform a patterning process.

(For the top gate electrode) furthermore, the step of forming the top gate electrode on the second gate insulation layer is to form a second metal layer on the second gate insulation layer, patterning the second metal layer to form the patterned top gate electrode.

Furthermore, the step of patterning the second metal layer is coating a photoresist on the second metal layer, then exposing and developing in order to form the top gate electrode pattern.

(For the data line and the top gate electrode) furthermore, when forming the top gate electrode on the second gate insulation layer, simultaneously forming the data line on the second gate insulation layer, and the data line and the top gate electrode are located at the same metal layer.

Furthermore, the step of when forming the top gate electrode on the second gate insulation layer, simultaneously forming the data line on the second gate insulation layer is to forming a second metal layer on the second gate insulation layer, and patterning the second metal layer to simultaneously obtain the patterned data line and the patterned top gate electrode.

Furthermore, the step of patterning the second metal layer is coating the photoresist on the second metal layer, then, sequentially exposing and developing in order to form a pattern of the data line and a pattern of the top gate electrode.

Furthermore, after forming the pattern of the data line and the pattern of the top gate electrode, removing the second metal layer not protected by the photoresist and the second gate insulation layer not protected by the photoresist, then, removing the photoresist.

Preferably, adopting a dry etching or a wet-etching method to remove the second metal layer not protected by the photoresist and the second gate insulation layer not protected by the photoresist.

Optionally, using a stripping method or using oxygen to perform a plasma bombardment method to remove the photoresist.

(For source electrode and drain electrode) furthermore, using the patterned top gate electrode as a protection layer, performing a plasma treatment to the patterned semiconductor layer such that outside of a protection range of the top gate electrode, the semiconductor layer respectively forms the source electrode and the drain electrode.

(For the source electrode and drain electrode, specifically) furthermore, the plasma treatment adopts a H2 or Argon (Ar) plasma treatment.

(For the interconnection layer and the contact holes) furthermore, forming an interconnection layer on the top gate electrode, patterning the interconnection layer, and forming multiple contact holes in the interconnection layer; the multiple contact holes are respectively corresponding to the data line, the source electrode and the drain electrode; and the multiple contact holes respectively expose an upper surface of the data line, an upper surface of the source electrode and an upper surface of the drain electrode.

(For ITO) furthermore, forming an ITO film layer on the interconnection layer and inside the multiple contact holes such that the ITO film realizes an interconnection between the data line and the source electrode and/or an interconnection between the drain electrode and the ITO film layer.

(Specifically) furthermore, patterning the ITO film layer by a photolithography process to form a first ITO film layer and a second ITO film layer, the first ITO film layer is used for realizing an interconnection between the data line and the source electrode and the second ITO film layer is interconnected with the drain electrode.

(For material) furthermore, the first gate insulation layer selects a SiOx or an aluminum oxide.

Furthermore, the second gate insulation layer selects a SiOx or an aluminum oxide.

Furthermore, the semiconductor layer selects an amorphous IGZO thin film

Furthermore, the interconnection layer is one of or a combination of a SiOx thin film and a SiNx thin film.

Comparing with the conventional art, the beneficial effects of the present invention is as followings:

In one aspect, in the manufacturing method of the present invention, the data line and the bottom gate electrode (or the top gate electrode) select a same metal layer, and the data line and the bottom gate electrode are formed by patterning through one photolithography process so that steps for manufacturing the dual gate oxide thin-film transistor is reduced in order to reduce the number of the masks. Besides, in the steps of interconnecting the data line and the source electrode and interconnecting the pixel electrode and the drain electrode, only depositing one layer of the ITO film layer, and through one photolithography process for patterning in order to realize the connection among the film layers so as to reduce the steps for manufacturing and reduce the number of the masks. By reducing the number of the masks, on one hand, the production cost can be reduced, and on the other hand, the steps for manufacturing are simplified which is beneficial for production efficiency. Finally, when patterning the film layers through the photolithography processes, the masks adopted are all normal masks, not half-tone masks. Because the cost adopting a half-tone mask and the manufacturing processes are higher and more complicated than a normal mask, the technology solution adopting a normal mask in the present embodiment can effective decrease the production cost and the complexity of the manufacturing process.

In another aspect, the oxide thin-film transistor obtained by the manufacturing method of the present invention is a dual gate oxide thin-film transistor, and the dual gate oxide thin-film transistor has opposite electric fields provided by the top gate electrode and the bottom gate electrode such that diffusing internal defects of the amorphous IGZO thin-film to the channel can be reduced in order to increase the stability of the thin-film transistor using the amorphous IGZO thin film as a semiconductor layer. Besides, in the structure of the thin film transistor of the present embodiment, an overlapping portion among the source electrode, the drain electrode and the gate electrode is less in order to decrease the intrinsic capacitance so as to reduce the RC time delay and increase the response speed of the thin film transistor.

DETAILED DESCRIPTION OF THE PREFERRED EMBODIMENT

Embodiment 1

Figure 1:
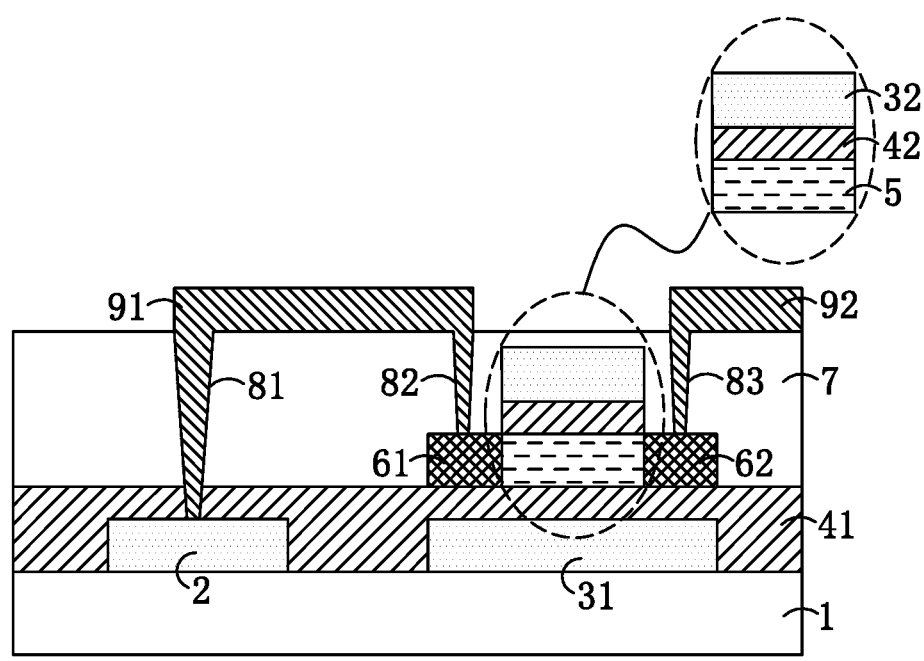
FIG. 1 is a schematic structure diagram of a dual oxide thin film transistor of a first embodiment.

The present embodiment provides a dual gate oxide thin-film transistor, as shown in FIG. 1, and comprises following structures:

a substrate 1 located at a bottom;

a patterned data line 2 and a patterned bottom gate electrode 31 which are located at a same layer and are on the substrate 1, wherein, the data line 2 is located in a left-side region and on the substrate 1, and the bottom gate electrode 31 is located in a right-side region and on the substrate 1;

a first gate insulation layer 41 disposed on the patterned data line 2, the patterned bottom gate electrode 31 and the substrate 1, wherein, the first gate insulation layer 41 selects SiOx film as an insulation layer of the bottom gate electrode 31;

a semiconductor layer 5 formed on the first gate insulation layer 41 and correspondingly located above the gate electrode 31, and the semiconductor layer selects an amorphous IGZO thin film;

a source electrode 61 formed at a left-side of the semiconductor layer 5 and a drain electrode 62 formed at a right-side of the semiconductor layer 5. The source electrode 61 and the drain electrode 62 are both formed after a plasma treatment to the semiconductor layer 5. Because the plasma treatment to the semiconductor layer 5 can increase the conductivity of the semiconductor layer so as to form the source electrode 61 and the drain electrode 62;

a second gate insulation layer 42 formed on the semiconductor layer 5, wherein the second gate insulation layer 42 selects a SiOx thin film;

a patterned top gate electrode 32 formed on the second gate insulation layer 42;

an interconnection layer 7 formed on the first gate insulation layer 41, the source electrode 61, the drain electrode 62 and the top gate electrode 32. The interconnection layer 7 is provided with a first contact hole 81 which partially exposes an upper surface of the data line 2, a second contact hole 82 which partially exposes an upper surface of the source electrode 61, a third contact hole 83 which partially exposes an upper surface of the drain electrode 62, wherein, the first contact hole 81 is also formed in the first gate insulation layer 41 such that the upper surface of the data line 2 is partially exposed;

an ITO film layer formed on the interconnection layer 7, inside the first contact hole 81, the second contact hole 82, and the third contact hole 83. After patterning the ITO film layer, a first ITO film layer 91 and a second ITO film layer 92 are formed. Besides, the second ITO film layer 92 is a pixel electrode, wherein, the first ITO film layer 91 is used for interconnecting the data line 2 and the source electrode 61, and the second ITO film layer 92 is interconnected to the drain electrode 62.

In the dual gate oxide thin-film transistor of the present embodiment, opposite electric fields are provided by the top gate electrode and the bottom gate electrode such that diffusing internal defects of the amorphous IGZO thin-film to the channel can be reduced in order to increase the stability of the thin-film transistor using the amorphous IGZO thin film as a semiconductor layer. Besides, in the structure of the thin-film transistor of the present embodiment, an overlapping portion among the source electrode, the drain electrode and the gate electrode is less in order to decrease the intrinsic capacitance so as to reduce the RC time delay and increase the response speed of the thin-film transistor.

Figure 2A:
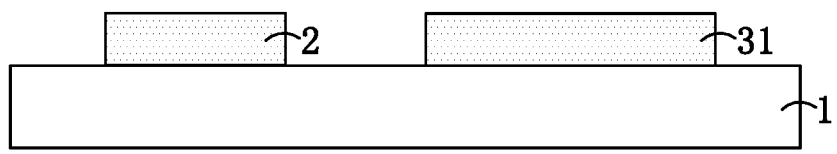
FIG. 2A to FIG. 2I are manufacturing processes of the dual oxide thin film transistor of the first embodiment.

The present embodiment also provides a manufacturing method for the dual gate oxide thin-film transistor described above, including following steps:

As shown in FIG. 2A, preparing a substrate 1, depositing a first metal layer on the substrate 1 based on a physical vapor deposition method, through a photolithography process to pattern the first metal layer, and simultaneously form a patterned data line 2 and a patterned bottom gate electrode 31.

In the present embodiment, the photolithography process means following processes: coating a photoresist on a film layer to be patterned, sequentially performing exposing, developing, etching, removing the photoresist and finally realizing a patterning treatment for corresponding film layer. Wherein, the mask used in exposing can adopt a normal mask, and does not require adopting a half-tone mask having a relative high cost.

Figure 2B:
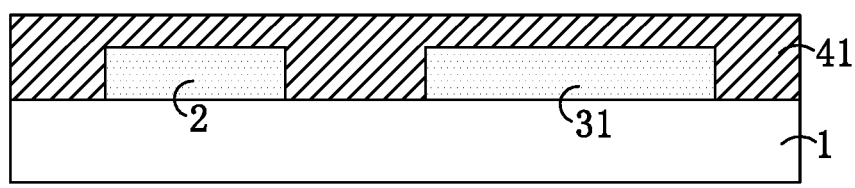

As shown in FIG. 2B, depositing a first gate insulation layer 41 on the patterned data line 2, the patterned bottom gate electrode 31, and the substrate 1 based on a chemical vapor deposition method, wherein, the first gate insulation layer selects a SiOx thin film as an insulation layer of the bottom gate electrode.

Figure 2C:
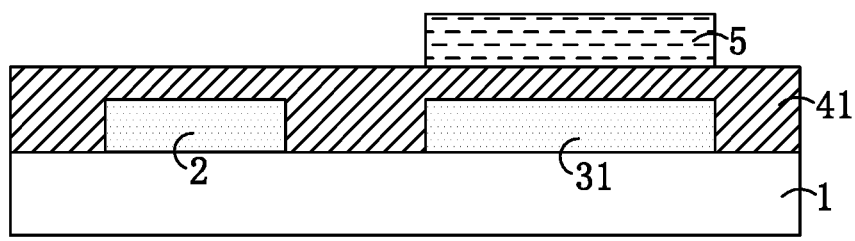

As shown in FIG. 2C, depositing an IGZO thin film as a semiconductor layer 5 on the first gate insulation layer 41 based on a physical vapor deposition method, then, through a photolithography process to pattern the semiconductor layer 5 in order to form a patterned semiconductor layer 5. The patterned semiconductor layer 5 also corresponds to an upper location of the bottom gate electrode 31.

Figure 2D:
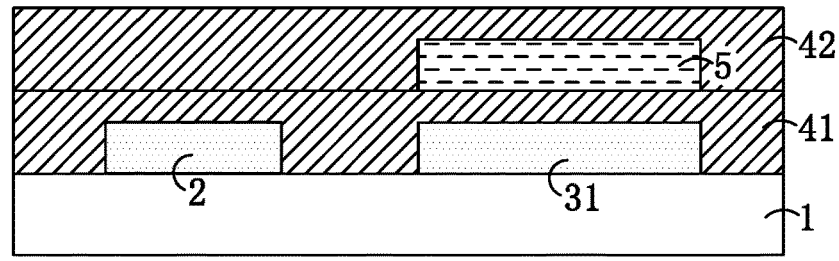

As shown in FIG. 2D, depositing a second gate insulation layer 42 on the patterned semiconductor layer 5 and the first gate insulation layer 41 based on a chemical vapor deposition method, wherein, the second gate insulation layer selects a SiOx thin film.

Figure 2E:
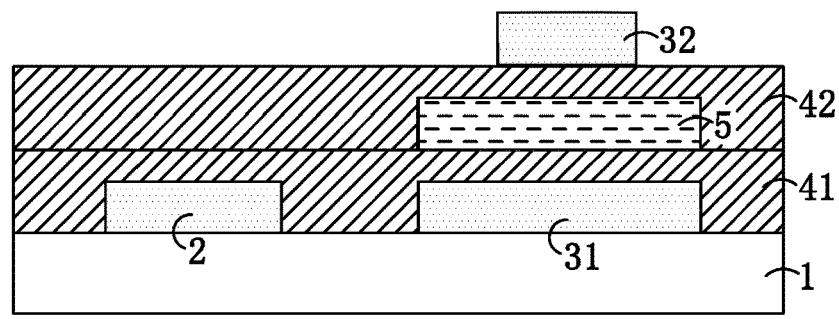
Figure 2F:
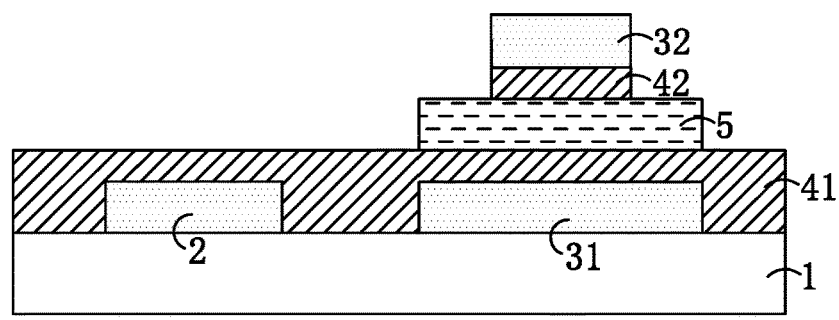

As shown in FIG. 2E, depositing a second metal layer on the second gate insulation layer 42 based on a physical vapor deposition. Patterning the second metal layer, specifically is: coating a photoresist (not shown in the figure) on the second metal layer, sequentially exposing and developing in order to form a pattern of a top gate electrode 32. As shown in FIG. 2F, adopting a dry etching or a wet etching method to remove the second metal layer not protected by the photoresist and the second gate insulation layer 42 not protected by the photoresist. Then, using a stripping method or using oxygen to perform a plasma bombardment method to remove the photoresist. Accordingly, a patterned top gate electrode 32 is obtained, and an excess portion of the second gate insulation layer 42 is also removed.

Figure 2G:
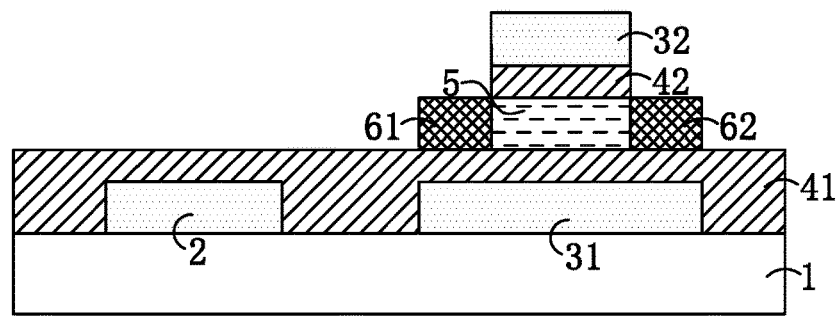

As shown in FIG. 2G, using the top gate electrode 32 as a protection layer, performing a H2 or Argon (Ar) plasma treatment to the patterned semiconductor layer 5 outside a protection range of the top gate electrode 32 such that the conductivity of the semiconductor layer outside the protection range of the top gate electrode is increased in order to form the source electrode 61 and the drain electrode 62.

Figure 2H:
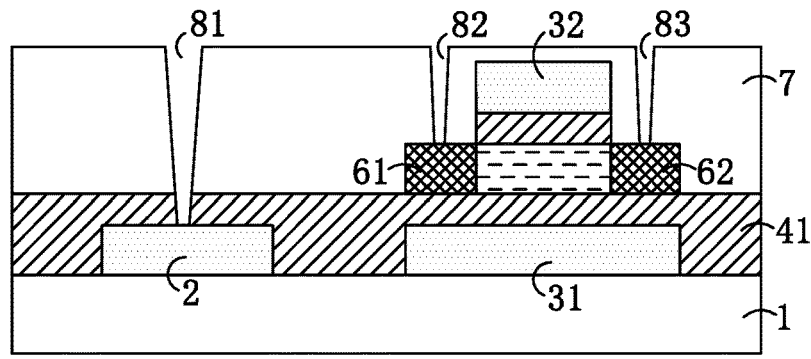

As shown in FIG. 2H, depositing an interconnection layer 7 on the first gate insulation layer 41, the source electrode 61, the drain electrode 62 and the top gate electrode 32, and the interconnection layer selects a SiOx thin film. Through a photolithography process to treat the interconnection layer 7 such that a first contact hole 81, a second contact hole 82 and a third contact hole 83 are formed in the interconnection layer 7. Wherein, the first contact hole 81 is communicated with the data line 2 such that an upper surface of the data line 2 is exposed, the second contact hole 82 is communicated with the source electrode 61 such that an upper surface of the source electrode 61 is exposed, the third contact hole 83 is communicated with the drain electrode 62 such that an upper surface of the drain electrode 62 is exposed.

Besides, in the present embodiment, the interconnection layer can also select a SiNx thin film or a thin film formed by SiOx and SiNx. When the interconnection layer selects the SiNx thin film, the step of "performing a H2 or Argon (Ar) plasma treatment to the patterned semiconductor layer 5 outside a protection range of the top gate electrode such that the conductivity of the semiconductor layer outside the protection range of the top gate electrode is increased in order to form the source electrode 61 and the drain electrode 62" described above is not required.

Figure 2I:
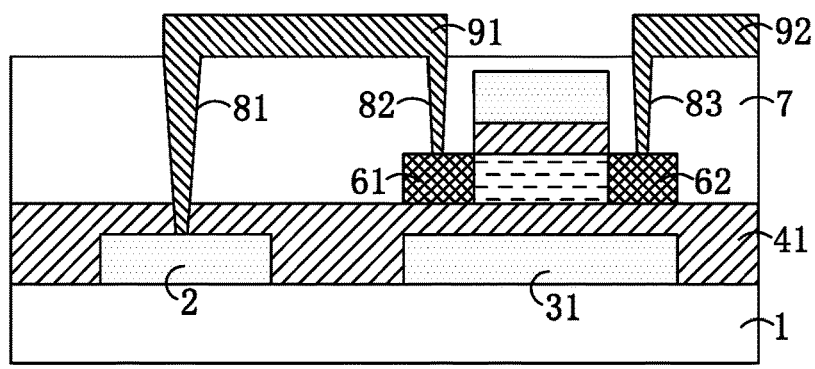

As shown in FIG. 2I, depositing an ITO film layer on the interconnection layer 7 and inside the first contact hole 81, the second contact hole 82 and the third contact hole 83, and through a photolithography process to pattern the ITO film layer in order to form a first ITO film layer 91 and a second ITO film layer 92. The second ITO film layer functions as a pixel electrode. Wherein, the first ITO film layer 91 is used for interconnecting the data line 2 and the source electrode 61, and the second ITO film layer 92 is interconnected with the drain electrode 62.

In the present embodiment, the data line and the bottom gate electrode select a same metal layer, and the data line and the bottom gate electrode are formed by patterning through one photolithography process so that steps for manufacturing the dual gate oxide thin-film transistor is reduced in order to reduce the number of the masks. Besides, in the steps of interconnecting the data line and the source electrode and interconnecting the pixel electrode and the drain electrode, only depositing one layer of the ITO film layer, and through one photolithography process for patterning in order to realize the connection among the film layers so as to reduce the steps for manufacturing and reduce the number of the masks. By reducing the number of the masks, on one hand, the production cost can be reduced, and on the other hand, the steps for manufacturing are simplified which is beneficial for production efficiency. Finally, when patterning the film layers through the photolithography processes, the masks adopted are all normal masks, not half-tone masks. Because the cost adopting a half-tone mask and the manufacturing processes are higher and more complicated than a normal mask, the technology solution adopting a normal mask in the present embodiment can effective decrease the production cost and the complexity of the manufacturing process.

Embodiment 2

Figure 3:
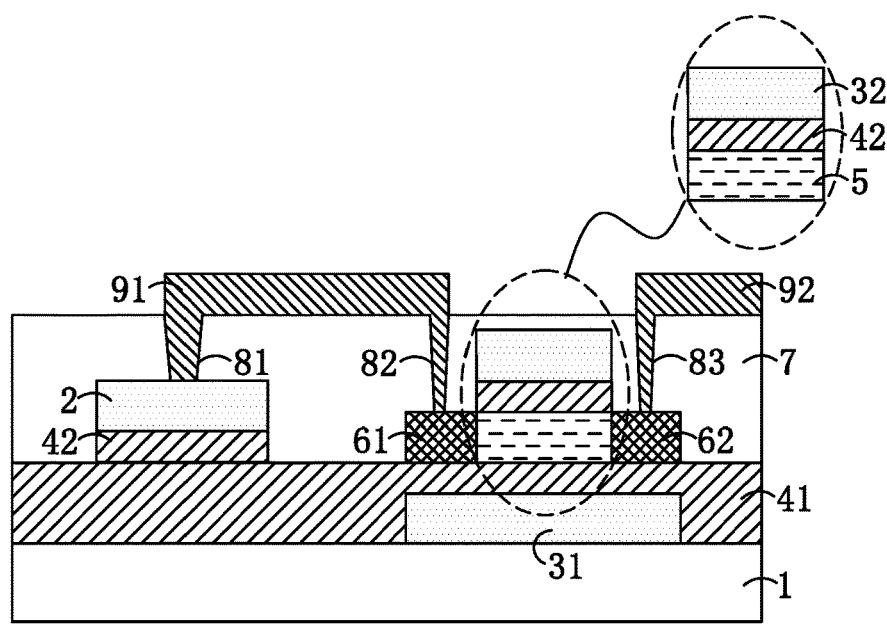
FIG. 3 is a schematic structure diagram of a dual oxide thin film transistor of a second embodiment.

The present embodiment provides a dual gate oxide thin-film transistor, as shown in FIG. 3, and comprises following structure:

a substrate 1 located at a bottom;

a patterned bottom gate electrode 31 located on the substrate 1, and the bottom gate electrode 31 is located in a right-side region on the substrate 1;

a first gate insulation layer 41 disposed on the substrate 1 and the patterned bottom gate electrode 31, wherein, the gate insulation layer 41 selects a SiOx film as an insulation layer of the bottom gate electrode 31;

a semiconductor layer 5 formed on the first gate insulation layer 41 and correspondingly located above the bottom gate electrode 31, and the semiconductor layer selects an amorphous IGZO thin film;

a source electrode 61 formed at a left-side of the semiconductor layer 5 and a drain electrode 62 formed at a right-side of the semiconductor layer 5. The source electrode 61 and the drain electrode 62 are both formed after a plasma treatment to the semiconductor layer 5. Because the plasma treatment to the semiconductor layer 5 can increase the conductivity of the semiconductor layer so as to form the source electrode 61 and the drain electrode 62;

a second gate insulation layer 42 formed on the semiconductor layer 5 and the first gate insulation layer 41, wherein the second gate insulation layer 42 selects a SiOx thin film. It can be understood that in the present embodiment, the second gate insulation layer includes two parts, a first part of the second gate insulation layer 42 is formed on the semiconductor layer 5 and located at a right-side region above the substrate 1, and a second part of the second gate insulation layer 42 is formed on the first gate insulation layer 41 and located at a left-side region above the substrate 1. Although the first part and the second part are both the second gate insulation layer, but the regions located are different. Besides, the film structures above the two parts of the second gate insulation layer are also different.

a patterned top gate electrode 32 and a patterned data line 2 which are formed on the second gate insulation layer 42 and are located at a same layer. Wherein, the top gate electrode 32 is located in a right-side region above the substrate 1, and the data line 2 is located at a left-side region above the substrate 1.

an interconnection layer 7 formed on the first gate insulation layer 41, the source electrode 61, the drain electrode 62, the top gate electrode 32 and the data line 2. The interconnection layer 7 is provided with a first contact hole 81 which exposes an upper surface of the data line 2, a second contact hole 82 which exposes an upper surface of the source electrode 61, a third contact hole 83 which exposes an upper surface of the drain electrode 62.

an ITO film layer formed on the interconnection layer 7, inside the first contact hole 81, the second contact hole 82, and the third contact hole 83. After patterning the ITO film layer, a first ITO film layer 91 and a second ITO film layer 92 are formed. Besides, the second ITO film layer 92 is a pixel electrode, wherein, the first ITO film layer 91 is used for interconnecting the data line 2 and the source electrode 61, and the second ITO film layer 92 is interconnected to the drain electrode 62.

In the dual gate oxide thin-film transistor of the present embodiment, opposite electric fields are provided by the top gate electrode and the bottom gate electrode such that diffusing internal defects of the amorphous IGZO thin-film to the channel can be reduced in order to increase the stability of the thin-film transistor using the amorphous IGZO thin film as a semiconductor layer. Besides, in the structure of the thin film transistor of the present embodiment, an overlapping portion among the source electrode, the drain electrode and the gate electrode is less in order to decrease the intrinsic capacitance so as to reduce the RC time delay and increase the response speed of the thin film transistor.

Figure 4A:
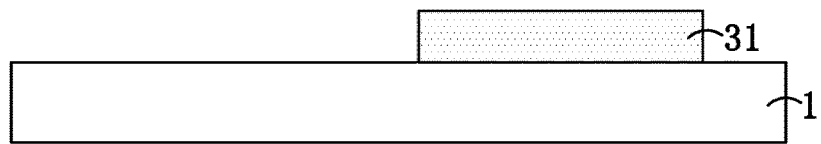
FIG. 4A to FIG. 4I are manufacturing processes of the dual oxide thin film transistor of the second embodiment.

The present embodiment also provides a manufacturing method for the dual gate oxide thin-film transistor described above, including following steps:

As shown in FIG. 4A, preparing a substrate 1, depositing a first metal layer on the substrate 1 based on a physical vapor deposition method, through a photolithography process to pattern the first metal layer in order to form a patterned bottom gate electrode 31.

In the present embodiment, the photolithography process means following processes: coating a photoresist on a film layer to be patterned, sequentially performing exposing, developing, etching, removing the photoresist and finally realizing a patterning treatment for corresponding film layer. Wherein, the mask used in exposing can adopt a normal mask, and does not require adopting a half-tone mask having a relative high cost.

Figure 4B:
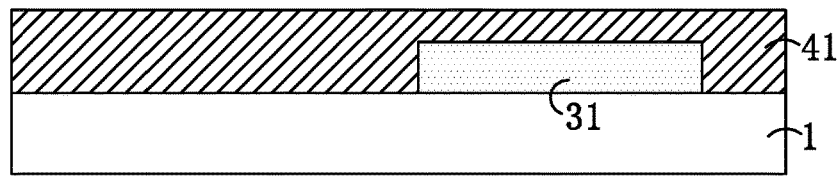

As shown in FIG. 4B, depositing a first gate insulation layer 41 on the patterned bottom gate electrode 31 and the substrate 1 based on a chemical vapor deposition method, wherein, the first gate insulation layer selects a SiOx thin film as an insulation layer of the bottom gate electrode.

Figure 4C:
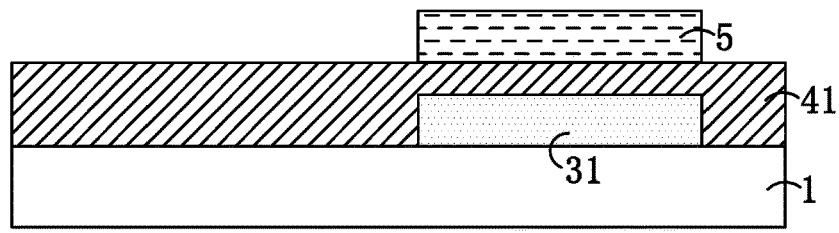

As shown in FIG. 4C, depositing an amorphous IGZO thin film as a semiconductor layer 5 on the first gate insulation layer 41 based on a physical vapor deposition method, then, through a photolithography process to pattern the semiconductor layer 5 in order to form a patterned semiconductor layer 5. The patterned semiconductor layer 5 also corresponds to an upper location of the bottom gate electrode 31.

Figure 4D:
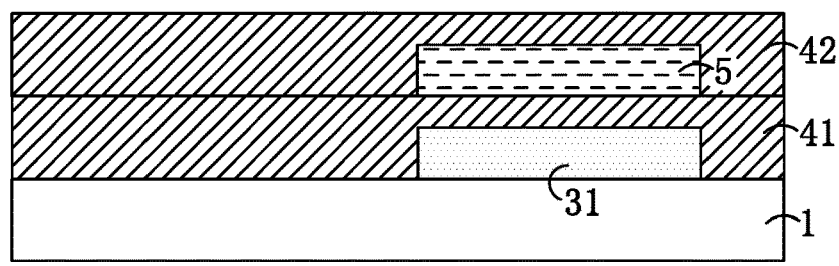

As shown in FIG. 4D, depositing a second gate insulation layer 42 on the patterned semiconductor layer 5 and the first gate insulation layer 41 based on a chemical vapor deposition method, wherein, the second gate insulation layer selects a SiOx thin film.

Figure 4E:
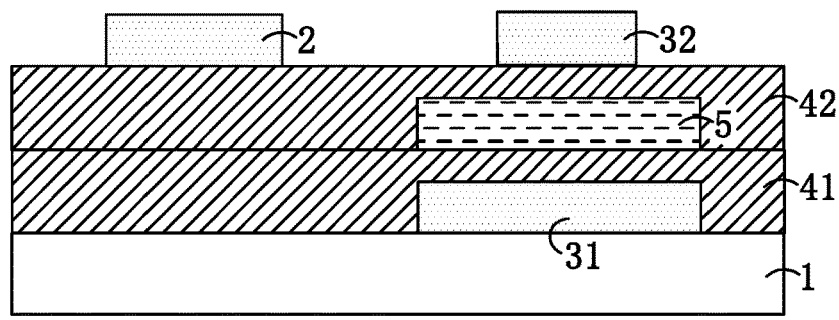
Figure 4F:
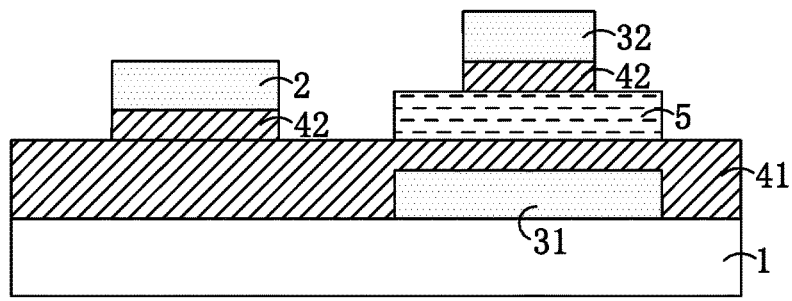

As shown in FIG. 4E, depositing a second metal layer on the second gate insulation layer 42 based on a physical vapor deposition method. Patterning the second metal layer, specifically is: coating a photoresist (not shown in the figure) on the second metal layer, sequentially exposing and developing in order to simultaneously form a pattern of the data line 2 and a pattern of a top gate electrode 32. Wherein, the pattern of the data line 2 is located at a left-side region above the substrate, and the pattern of the top gate electrode 32 is located at a right-side region above the substrate. As shown in FIG. 4F, adopting a dry etching or a wet etching method to remove the second metal layer not protected by the photoresist and the second gate insulation layer 42 not protected by the photoresist. Then, using a stripping method or using oxygen to perform a plasma bombardment method to remove the photoresist. Accordingly, a patterned data line and a patterned top gate electrode 32 are simultaneously obtained through one patterning process, and an excess portion of the second gate insulation layer 42 is also removed.

Figure 4G:
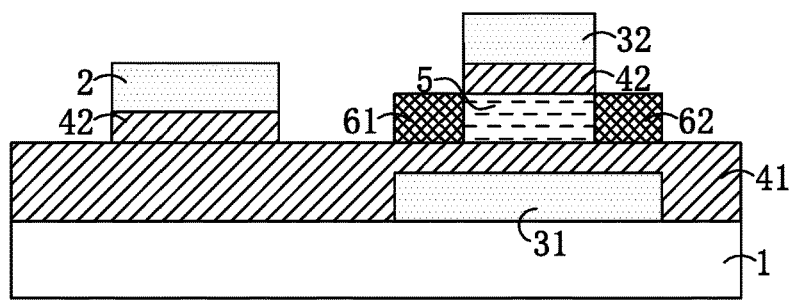

As shown in FIG. 4G, using the top gate electrode 32 as a protection layer, performing a H2 or Argon (Ar) plasma treatment to the patterned semiconductor layer 5 outside a protection range of the top gate electrode 32 such that the conductivity of the semiconductor layer outside the protection range of the top gate electrode is increased in order to form the source electrode 61 and the drain electrode 62.

Figure 4H:
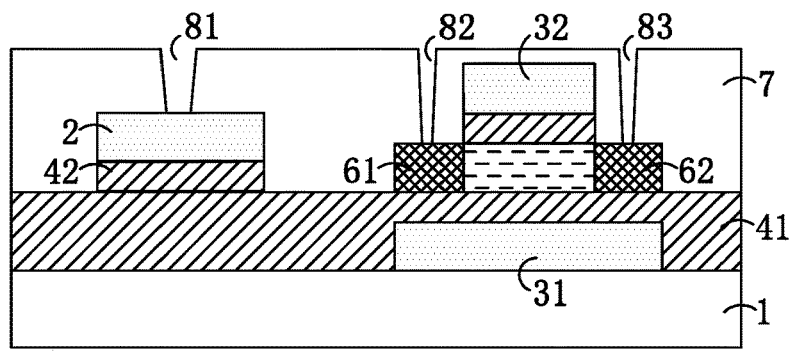

As shown in FIG. 4H, depositing an interconnection layer 7 on the first gate insulation layer 41, the source electrode 61, the drain electrode 62, the top gate electrode 32 and the data line 2, and the interconnection layer selects a SiOx thin film. Through a photolithography process to treat the interconnection layer 7 such that a first contact hole 81, a second contact hole 82 and a third contact hole 83 are formed in the interconnection layer 7. Wherein, the first contact hole 81 is communicated with the data line 2 such that an upper surface of the data line 2 is exposed, the second contact hole 82 is communicated with the source electrode 61 such that an upper surface of the source electrode 61 is exposed, the third contact hole 83 is communicated with the drain electrode 62 such that an upper surface of the drain electrode 62 is exposed.

Besides, in the present embodiment, the interconnection layer can also select a SiNx thin film or a thin film formed by SiOx and SiNx. When the interconnection layer selects the SiNx thin film, the step of "performing a H2 or Argon (Ar) plasma treatment to the patterned semiconductor layer 5 outside a protection range of the top gate electrode 32 such that the conductivity of the semiconductor layer outside the protection range of the top gate electrode is increased in order to form the source electrode 61 and the drain electrode 62" described above is not required.

Figure 4I:
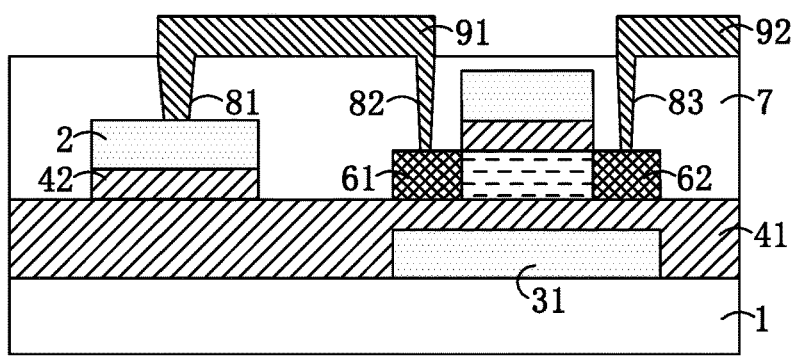

As shown in FIG. 4I, depositing an ITO film layer on the interconnection layer 7 and inside the first contact hole 81, the second contact hole 82 and the third contact hole 83, and through a photolithography process to pattern the ITO film layer in order to form a first ITO film layer 91 and a second ITO film layer 92. The second ITO film layer functions as a pixel electrode. Wherein, the first ITO film layer 91 is used for interconnecting the data line 2 and the source electrode 61, and the second ITO film layer 92 is interconnected with the drain electrode 62.

In the present embodiment, the data line and the bottom gate electrode select a same metal layer, and the data line and the bottom gate electrode are formed by patterning through one photolithography process so that steps for manufacturing the dual gate oxide thin film is reduced in order to reduce the number of the masks. Besides, in the steps of interconnecting the data line and the source electrode and interconnecting the pixel electrode and the drain electrode, only depositing one layer of the ITO film layer, and through one photolithography process for patterning in order to realize the connection among the film layers so as to reduce the steps for manufacturing and reduce the number of the mask. By reducing the number of the mask, one hand, the production cost can be reduced, and on the other hand, the steps for manufacturing are simplified which is beneficial for production efficiency. Finally, when patterning the film layers through the photolithography processes, the masks adopted are all normal masks, not half-tone masks. Because the cost adopting a half-tone mask and the manufacturing processes are higher and more complicated than a normal mask, the technology solution adopting a normal mask in the present embodiment can effective decrease the production cost and the complexity of the manufacturing process.

The above description only illustrates the main structure of the dual gate oxide thin-film transistor, and the dual gate oxide thin-film transistor can include other structures having normal functions, the present invention does not repeat again.

The above embodiment does not constitute a limitation of the scope of protection of the present technology solution. The person skilled in the art can understand: without exceeding the principle and spirit of the present invention, the above embodiments can be improved. Any modifications, equivalent replacements and improvements based on the spirit and principles of the above embodiments should also be included in the protection scope of the present technology solution.

What is claimed is:

1. A dual gate oxide thin-film transistor comprising:
a substrate;
a bottom gate electrode formed on the substrate;
a first gate insulation layer disposed on the bottom gate electrode;
a semiconductor layer formed on the first gate insulation layer;
a second gate insulation layer formed on the semiconductor layer; and
a top gate electrode formed on the second gate insulation layer;
wherein, the dual gate oxide thin-film transistor further comprises a data line, the data line and the bottom gate electrode are located at a same metal layer or the data line and the top gate electrode are located at a same metal layer;
wherein second gate insulation layer only covers on the semiconductor layer;
wherein the dual gate oxide thin-film transistor further comprises a source electrode and a drain electrode respectively located at two sides of the semiconductor layer without covering the semiconductor layer; and
wherein, the dual gate oxide thin-film transistor further comprises a planarization layer formed on the first gate insulation layer, the source electrode, the drain electrode and the top gate electrode; the planarization layer is provided with multiple contact holes; the multiple contact holes are respectively corresponding to the data line, the source electrode and the drain electrode; and the multiple contact holes respectively expose an upper surface of the data line, an upper surface of the source electrode and an upper surface of the drain electrode.

2. The dual gate oxide thin-film transistor according to claim 1, wherein, the source electrode and the drain electrode are obtained through performing a plasma treatment to the semiconductor layer.

3. The dual gate oxide thin-film transistor according to claim 2, wherein, the data line and the bottom gate electrode are located at a same metal layer, and the multiple contact holes includes a first contact hole that exposes the upper surface of the data line through penetrating the planarization layer and the first gate insulation layer.

4. The dual gate oxide thin-film transistor according to claim 3, wherein, the dual gate oxide thin-film transistor further comprises an ITO film layer formed on the planarization layer and inside the multiple contact holes; the ITO film layer is used for realizing an interconnection between the data line and the source electrode and/or an interconnection between the drain electrode and the ITO film layer.

5. A manufacturing method for a dual gate oxide thin film transistor, comprising steps of:
preparing a substrate,
forming a bottom gate electrode on the substrate;
forming a first gate insulation layer on the bottom gate electrode;
forming a semiconductor layer on the first gate insulation layer;
forming a second gate insulation layer on the semiconductor layer; and
forming a top gate electrode on the second gate insulation layer;
wherein, the dual gate oxide thin-film transistor further comprises a data line, the data line and the bottom gate electrode are located at a same metal layer, or the data line and the top gate electrode are located at a same metal layer;
wherein second gate insulation layer only covers on the semiconductor layer;
wherein the dual gate oxide thin-film transistor further comprises a source electrode and a drain electrode respectively located at two sides of the semiconductor layer without covering the semiconductor layer; and
wherein, the dual gate oxide thin-film transistor further comprises a planarization layer formed on the first gate insulation layer, the source electrode, the drain electrode and the top gate electrode; the planarization layer is provided with multiple contact holes; the multiple contact holes are respectively corresponding to the data line, the source electrode and the drain electrode; and the multiple contact holes respectively expose an upper surface of the data line, an upper surface of the source electrode and an upper surface of the drain electrode.

6. The manufacturing method according to claim 5, wherein, the step of forming a bottom gate electrode on the substrate comprises forming a first metal layer on the substrate and patterning the first metal layer to obtain the patterned bottom gate electrode.

7. The manufacturing method according to claim 6, wherein, when forming the top gate electrode on the second gate insulation layer, simultaneously forming the data line on the second gate insulation layer, and the data line and the top gate electrode are located at the same metal layer.

8. The manufacturing method according to claim 7, wherein, the step of when forming the top gate electrode on the second gate insulation layer, simultaneously forming the data line on the second gate insulation layer is to forming a second metal layer on the second gate insulation layer, and patterning the second metal layer to simultaneously obtain the patterned data line and the patterned top gate electrode.

9. The manufacturing method according to claim 5, wherein, the step of forming a bottom gate electrode on the substrate comprises forming a first metal layer on the substrate and patterning the first metal layer one time in order to simultaneously obtain the patterned data line and the patterned bottom gate electrode such that the data line and the bottom gate electrode are located at the same metal layer and are both located on the substrate.

* * * * *